United States Patent
Peterson et al.

(10) Patent No.: US 11,693,443 B2
(45) Date of Patent: *Jul. 4, 2023

(54) CONFIGURATION CIRCUIT FOR RECONFIGURABLE OUTPUT

(71) Applicant: Meta Platforms Technologies, LLC, Menlo Park, CA (US)

(72) Inventors: Jonathan Robert Peterson, Woodinville, WA (US); Andrew John Ouderkirk, Redmond, WA (US); Maik Andre Scheller, Redmond, WA (US); Christopher Yuan-Ting Liao, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/733,971

(22) Filed: Apr. 29, 2022

(65) Prior Publication Data

US 2022/0261025 A1  Aug. 18, 2022

Related U.S. Application Data

(63) Continuation of application No. 16/944,575, filed on Jul. 31, 2020, now Pat. No. 11,347,252.

(51) Int. Cl.
*G05F 1/00* (2006.01)
*G05F 1/625* (2006.01)
*H02S 40/30* (2014.01)

(52) U.S. Cl.
CPC .............. *G05F 1/625* (2013.01); *H02S 40/30* (2014.12)

(58) Field of Classification Search
CPC .................................. G05F 1/625; H02S 40/30
USPC ......................................................... 307/109
See application file for complete search history.

(56) References Cited

U.S. PATENT DOCUMENTS

| | | | |
|---|---|---|---|
| 10,135,252 B2* | 11/2018 | Chatterjee | H02M 3/1584 |
| 10,224,827 B1* | 3/2019 | Zhu | H02M 3/33576 |
| 10,862,399 B1* | 12/2020 | Rai | H02M 3/33515 |
| 10,886,857 B1* | 1/2021 | Karsten | H01F 27/2885 |
| 11,100,034 B1* | 8/2021 | Vispute | G06F 1/266 |
| 11,347,252 B1* | 5/2022 | Peterson | H01L 31/12 |
| 2014/0340940 A1* | 11/2014 | Ouyang | H01F 30/06 336/170 |
| 2016/0020016 A1* | 1/2016 | Ouyang | H02M 3/33561 363/21.04 |
| 2017/0241155 A1* | 8/2017 | Johnson | B66F 17/006 |
| 2019/0181744 A1* | 6/2019 | Cohen | H02M 1/12 |
| 2019/0222211 A1* | 7/2019 | Yang | H03K 17/785 |
| 2020/0266715 A1* | 8/2020 | Ness | G01R 19/0092 |
| 2020/0350117 A1* | 11/2020 | Nabih | H01F 38/00 |
| 2020/0412238 A1* | 12/2020 | Zhu | H02M 1/4216 |
| 2021/0273570 A1* | 9/2021 | Ness | G01R 31/42 |

* cited by examiner

*Primary Examiner* — Ryan Jager
(74) *Attorney, Agent, or Firm* — Freestone Intellectual Property Law PLLC; Aaron J. Visbeek

(57) ABSTRACT

A configuration circuit may be used with a power converter. The configuration circuit dynamically reconfigures one or more connections of output stages of a power converter to vary the output. A capacitive load may receive the output of the power converter.

16 Claims, 12 Drawing Sheets

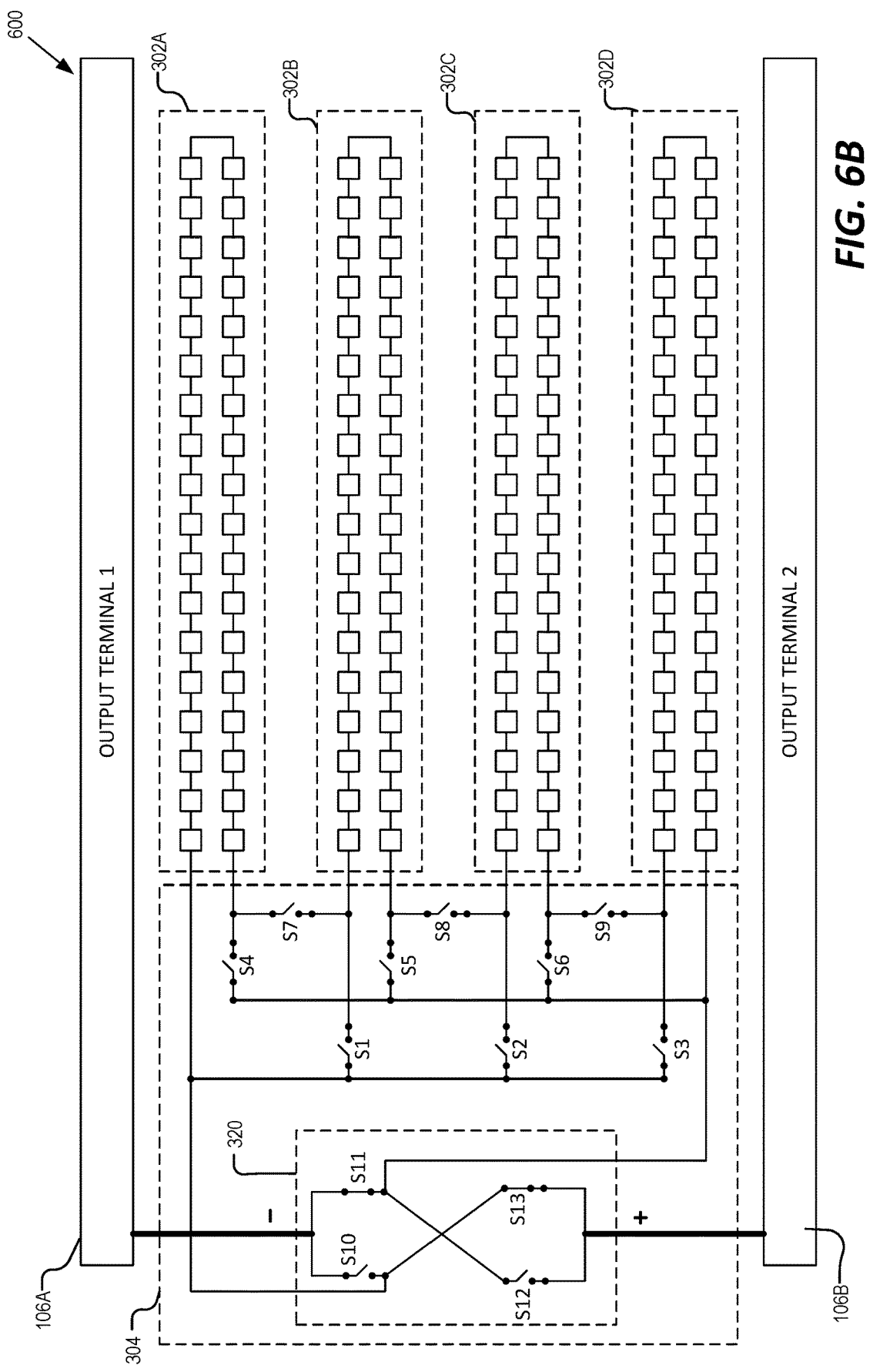

CONFIGURATION CIRCUIT FOR RECONFIGURABLE OUTPUT

CROSS-REFERENCE TO RELATED APPLICATIONS

This application claims priority to U.S. non-provisional application Ser. No. 16/944,575 filed Jul. 31, 2020, which is hereby incorporated by reference.

BACKGROUND INFORMATION

A smart device is an electronic device that typically communicates with other devices or networks. In some situations the smart device may be configured to operate interactively with a user. A smart device may be designed to support a variety of form factors, such as a head mounted device, a head mounted display (HMD), or a smart display, just to name a few.

Smart devices may include one or more electronic components for use in a variety of applications, such as gaming, aviation, engineering, medicine, entertainment, video/audio chat, activity tracking, and so on. These electronic components require power to operate. Thus, in some examples, the smart device may be configured to receive wired power and/or may be configured to be powered by one or more batteries. Typically, the smart device includes one or more power converters to convert the received energy from one form to another to power the electronic components.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 6A and 6B illustrate an example polarity configuration circuit of a power converter, in accordance with aspects of the disclosure.

DETAILED DESCRIPTION

Embodiments of a power converter, an apparatus, and a configuration circuit are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As mentioned above, electronic components require power to operate and thus, a power converter may be utilized to convert energy received from a main supply or battery into a form useable by the electronic component. For example, the power converter may be a voltage-to-voltage converter (e.g., a step-up or step-down converter), a current-to-current converter, a voltage-to-current converter, or a current-to-voltage converter, and so on. Conventional systems are typically designed to provide a static output to the load. However, in some implementations, the electronic component may include a capacitive or an inductive load, where the current and voltage supplied to the load are out of phase. Driving a load with a static output (and with a static output impedance) means that the time required to charge the load may increase, especially with loads that require a variable output voltage, such as with electro-mechanical actuators.

Accordingly, aspects of the present disclosure provide for a power converter that includes a dynamically reconfigurable output. As will be described below, a configuration circuit may be included in the power converter to dynamically reconfigure connections between several output stages of the power converter to adjust a combined output voltage, a combined output current, and/or a combined output impedance of the power converter.

For a device that needs an adjustable output voltage that dynamically changes between voltage levels, the output impedance of the power converter may be dynamically adjusted. Thus, the charging of a load, such as a capacitive and/or inductive load may be achieved in a faster and more efficient manner, as compared to the conventional static output converters discussed above.

Figure 1:
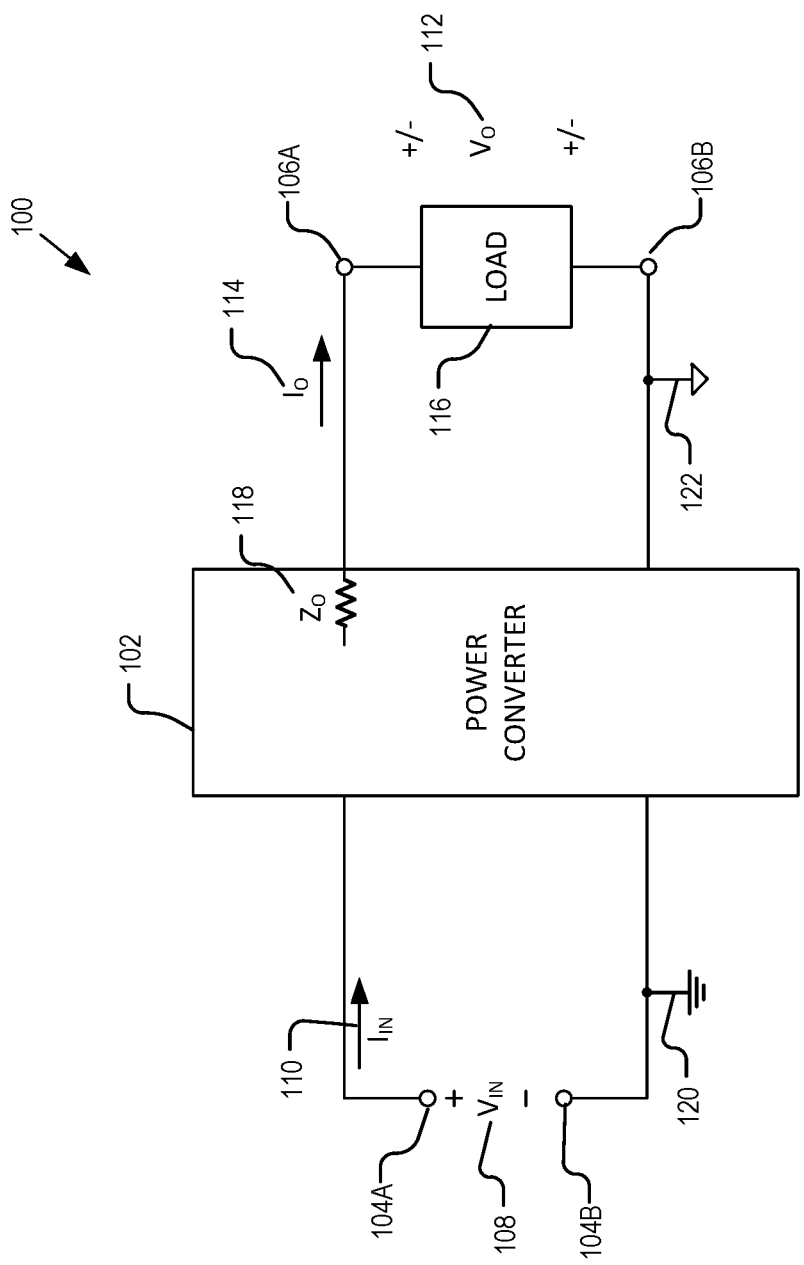
FIG. 1 illustrates an example apparatus that includes a power converter with a reconfigurable output, in accordance with aspects of the disclosure.

FIG. 1 illustrates an example apparatus 100 that includes a power converter 102 with a reconfigurable output, in accordance with aspects of the disclosure. The example apparatus 100 of FIG. 1 is shown as including the power converter 102, input terminals 104A and 104B, and output terminals 106A and 106B. Also shown in FIG. 1 is an input voltage 108, an input current 110, an output voltage 112, an output current 114, a load 116, an output impedance 118, an input ground reference 120, and an output ground reference 122.

In some aspects, the power converter 102 may be configured to receive a constant input voltage (e.g., input voltage 108), a constant input current (e.g., input current 110), or some combination thereof. As shown in FIG. 1, the power converter 102 is coupled between the input terminals 104A/104B and the output terminals 106A/106B to transfer energy received at the input terminals 104A/104B to the load 116. In some implementations, power converter 102 is an isolated power converter, where the input terminals 104A/104B are electrically isolated from the output terminals 106A/106B and/or where the input ground reference 120 may be at a different potential from the output ground reference 122.

Figure 2:
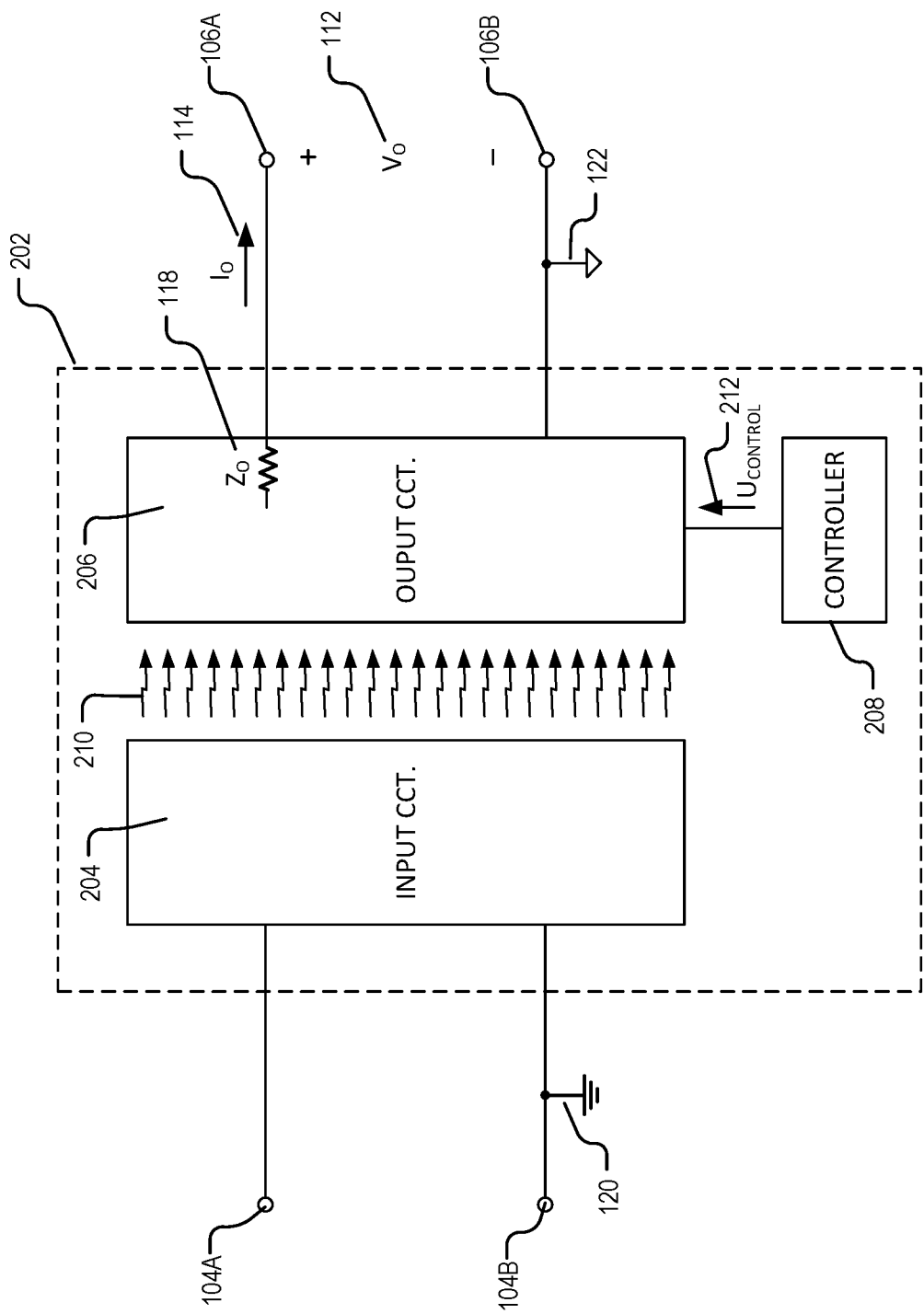
FIG. 2 illustrates an example power converter, in accordance with aspects of the disclosure.

By way of example, FIG. 2 illustrates an example power converter 202, in accordance with aspects of the disclosure. Power converter 202 is one possible implementation of power converter 102 of FIG. 1, where power converter 202 is an isolated power converter. Power converter 202 is shown as including an input circuit 204, an output circuit 206, and a controller 208. FIG. 2 also illustrates light (i.e., light energy 210) and a control signal 212.

In the illustrated example, input circuit 204 is configured to generate light energy 210 in response to the input voltage and/or current received at input terminals 104A/104B. In some embodiments, input circuit 204 includes an array of light emitting diodes (LEDs) configured to generate the light energy 210. The output circuit 206 then receives the light energy 210 and converts the light energy 210 into output voltage 112, output current 114, or some combination thereof, that is provided to a load at the output terminals 106A/106B. In some aspects, the output circuit 206 includes one or more photosensitive cells, such as photovoltaic cells for generating the output voltage 112 and/or output current 114 in response to the light energy 210.

The controller 208 is configured to generate a control signal 212, which is provided to the output circuit 206 to adjust the output voltage 112, the output current 114, and/or the output impedance 118 of the power converter 202. In some embodiments, the output circuit includes a plurality of output stages (not shown in FIG. 2), where each output stage generates a partial output voltage or current. The partial output voltages and/or currents are combined to generate a combined output voltage (e.g., output voltage 112) and/or a combined output current (e.g., output current 114).

Figure 3:
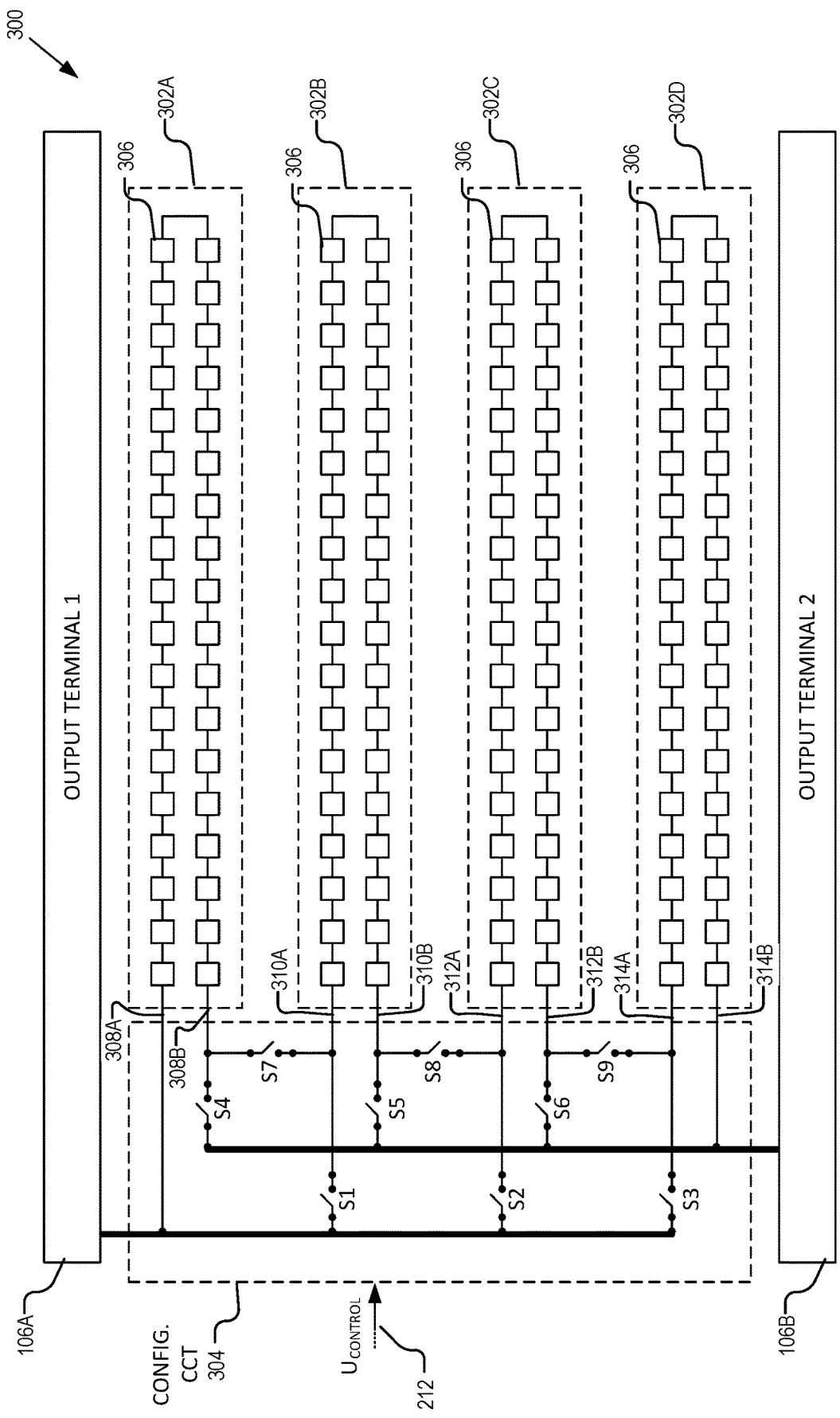
FIG. 3 illustrates an output circuit of a power converter, in accordance with aspects of the disclosure.

For example, FIG. 3 illustrates an output circuit 300 of a power converter, in accordance with aspects of the disclosure. Output circuit 300 is one possible implementation of output circuit 206 of FIG. 2. The illustrated example of the output circuit 300 is shown as including output stages 302A-302D and a configuration circuit 304. Configuration circuit 304 is shown as including switches S1-S9. Each output stage 302A-302D is shown as including one or more photosensitive cells 306 and respective first and second terminals (i.e., first and second terminals 308A and 308B, 310A and 310B, 312A and 312B, and 314A and 314B).

In some aspects, the photosensitive cells 306 are disposed to receive light energy that is generated by the input circuit of the power converter (e.g., light energy 210 of FIG. 2) and to convert the light energy into a partial output voltage or current that is provided at a terminal of a respective output stage. For example, the photosensitive cells 306 of the output stage 302A may generate a partial output current at the terminal 308B. Similarly, the photosensitive cells 306 of output stage 302C may generate another partial output current at terminal 312B.

The configuration circuit 304 is coupled to the output stages 302A-302D to dynamically reconfigure a connection among the output stages 302A-302D in response to the control signal 212. That is, the switches S1-S9 may be selectively enabled and disabled to reconfigure the connection among the output stages 302A-302D. For example, the switches S1-S9 may be controlled to reconfigure the output stages into: (1) a series configuration (i.e., where each output stage 302A-302D is connected in series), (2) a parallel configuration (i.e., where each output stage 302A-302D is connected in parallel), or (3) a series-parallel configuration (i.e., where some of the output stages 302A-302D are connected and series and some of the output stages 302A-302D are connected in parallel).

Although FIG. 3 illustrates the output circuit 300 as including four output stages, aspects of the present disclosure may include an output circuit that includes any number of output stages, including two or more. In addition, although FIG. 3 illustrates the control circuit 304 as including nine switches, the configuration circuit 304 may include any number of switches, depending, in part, on the number of output stages.

In some aspects, the configuration circuit 304 includes one or more switches for each output stage. For example, configuration circuit 304 includes a switch S4 and a switch S7, where switch S4 is configured to selectively connect the terminal 308B to the output terminal 106B and where switch S7 is configured to selectively connect the terminal 308B to terminal 310A of the output stage 302B. Switches S1, S5, and S8 correspond to output stage 302B, where switch S1 selectively connects terminal 310A to the output terminal 106A, switch S5 selectively connects terminal 310B to the output terminal 106B, and the switch S8 selectively connects the terminal 310B to the terminal 312A of the output stage 302C. Similarly, switches S2, S6, and S9 correspond to output stage 302C, where switch S2 selectively connects terminal 312A to the output terminal 106A, switch S6 selectively connects terminal 312B to the output terminal 106B, and the switch S9 selectively connects the terminal 312B to the terminal 314A of the output stage 302D. Lastly, switch S3 corresponds to the output stage 302D, where switch S3 is configured to selectively connect the terminal 314A to the output terminal 106A.

Figure 4A:
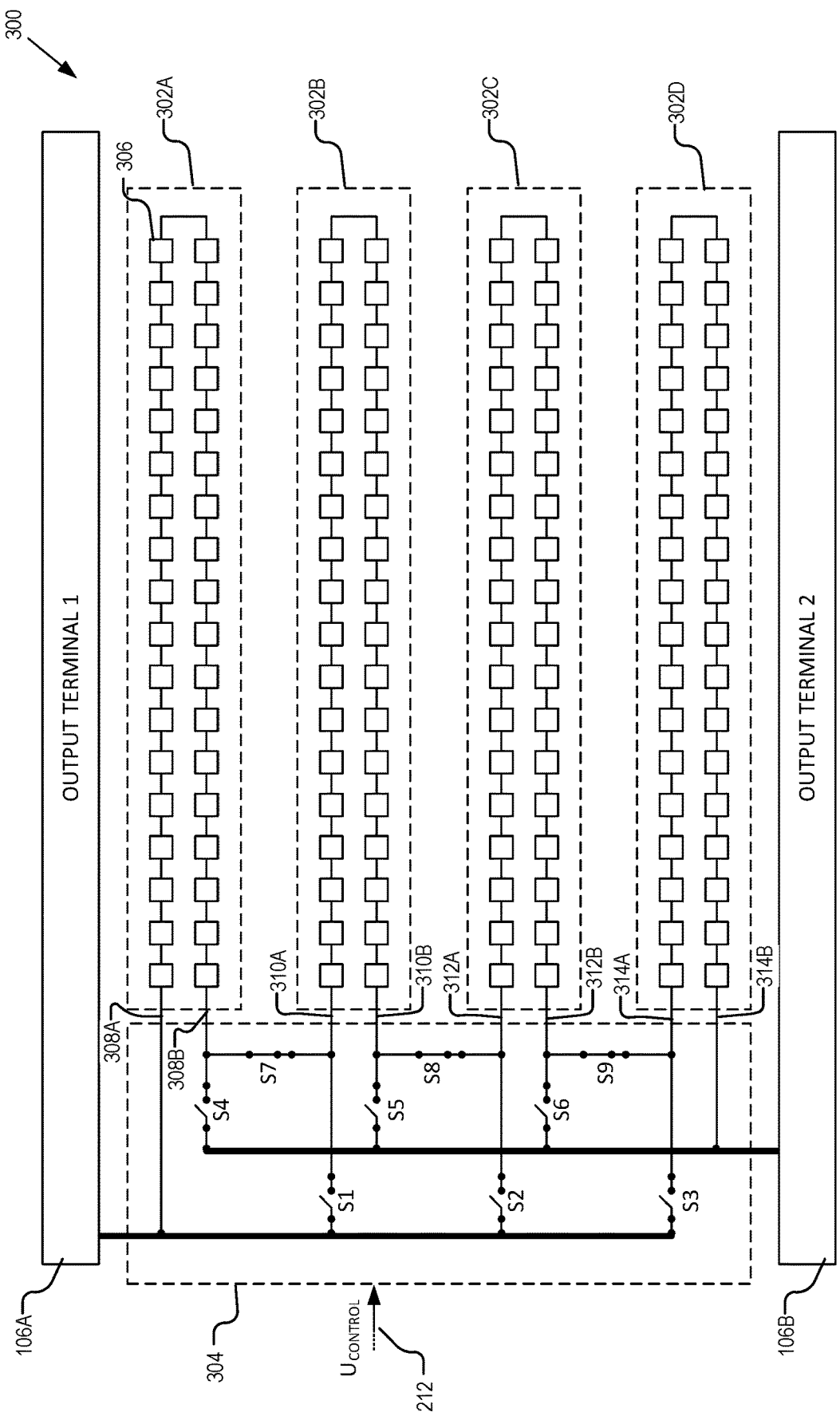
FIGS. 4A and 4B illustrate output stages of an output circuit connected in a series configuration, in accordance with aspects of the disclosure.
Figure 4B:
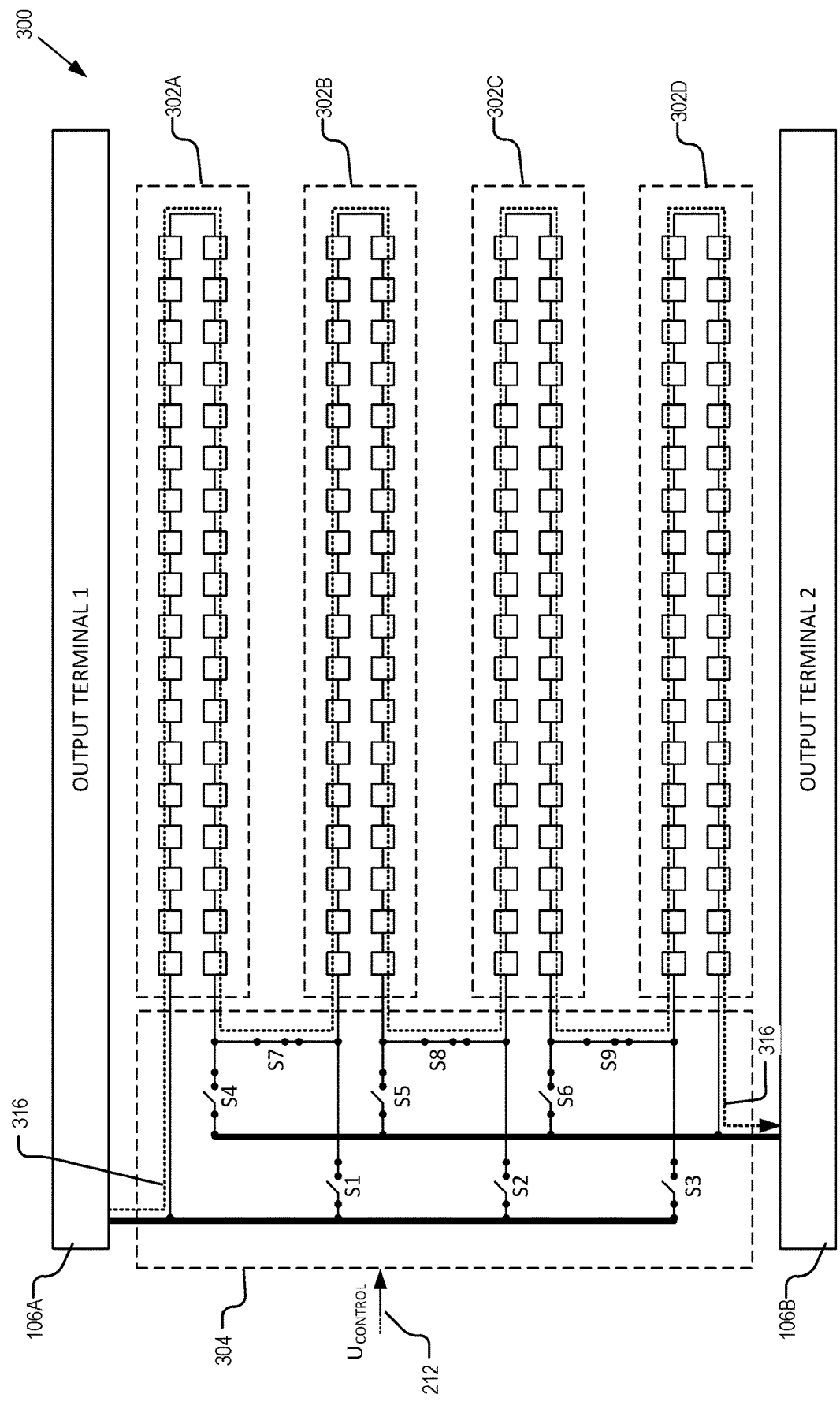

FIGS. 4A and 4B illustrate output stages 302A-302D of output circuit 300 connected in a series configuration, in accordance with aspects of the disclosure. For the series configuration of FIGS. 4A and 4B, the controller (e.g., controller 208 of FIG. 2) may generate the control signal 212 to enable (i.e., close) switches S7, S8, and S9, and to disable (i.e., open) switches S1, S2, S3, S4, S5, and S6. FIG. 4B illustrates a current path 316 when the output stages 302A-302D are connected in the series configuration. In some embodiments, the power converter generates a maximum output voltage and/or a maximum output impedance when the output stages 302A-302D are connected in the series configuration.

Figure 5A:
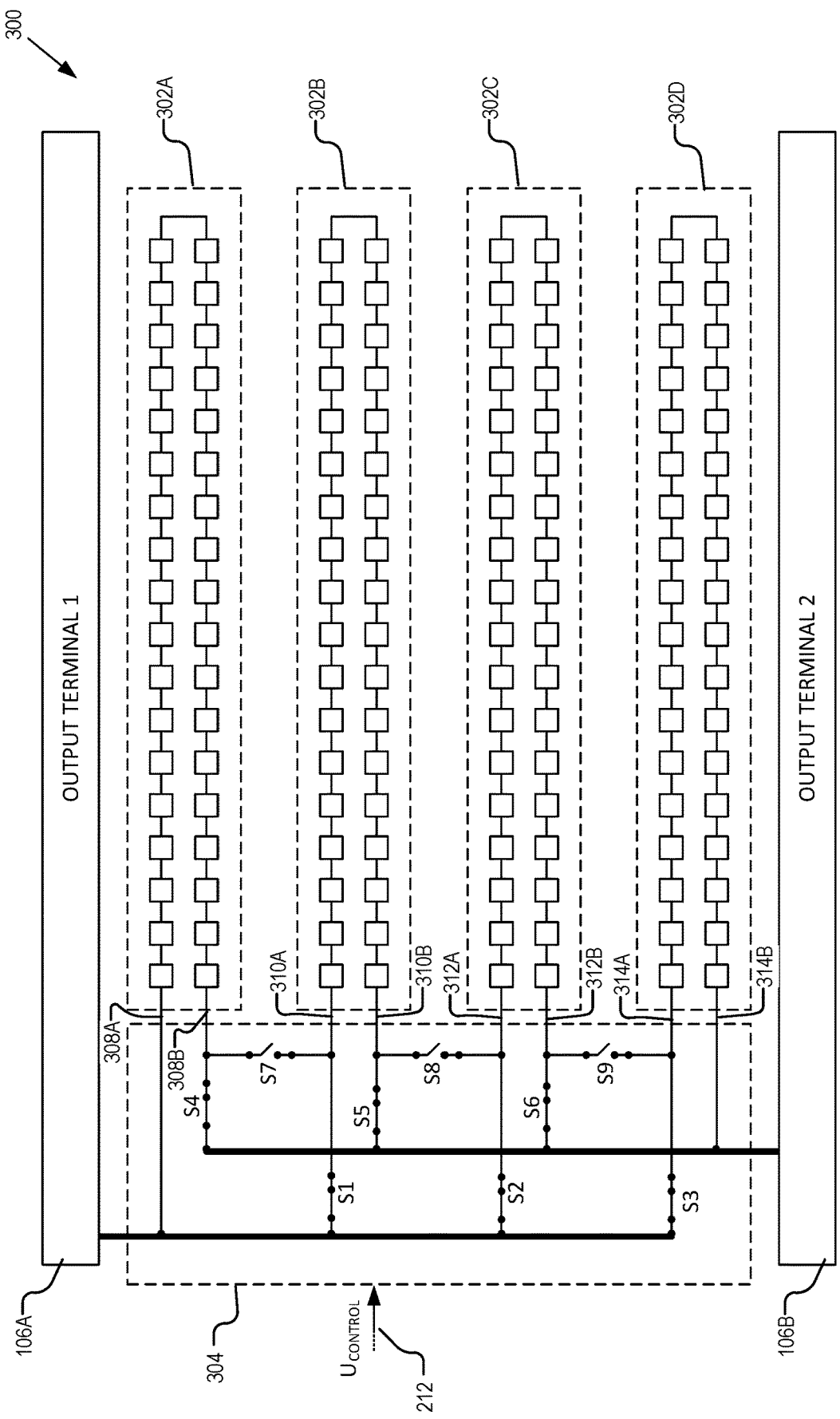
FIGS. 5A and 5B illustrate output stages of an output circuit connected in a parallel configuration, in accordance with aspects of the disclosure.
Figure 5B:
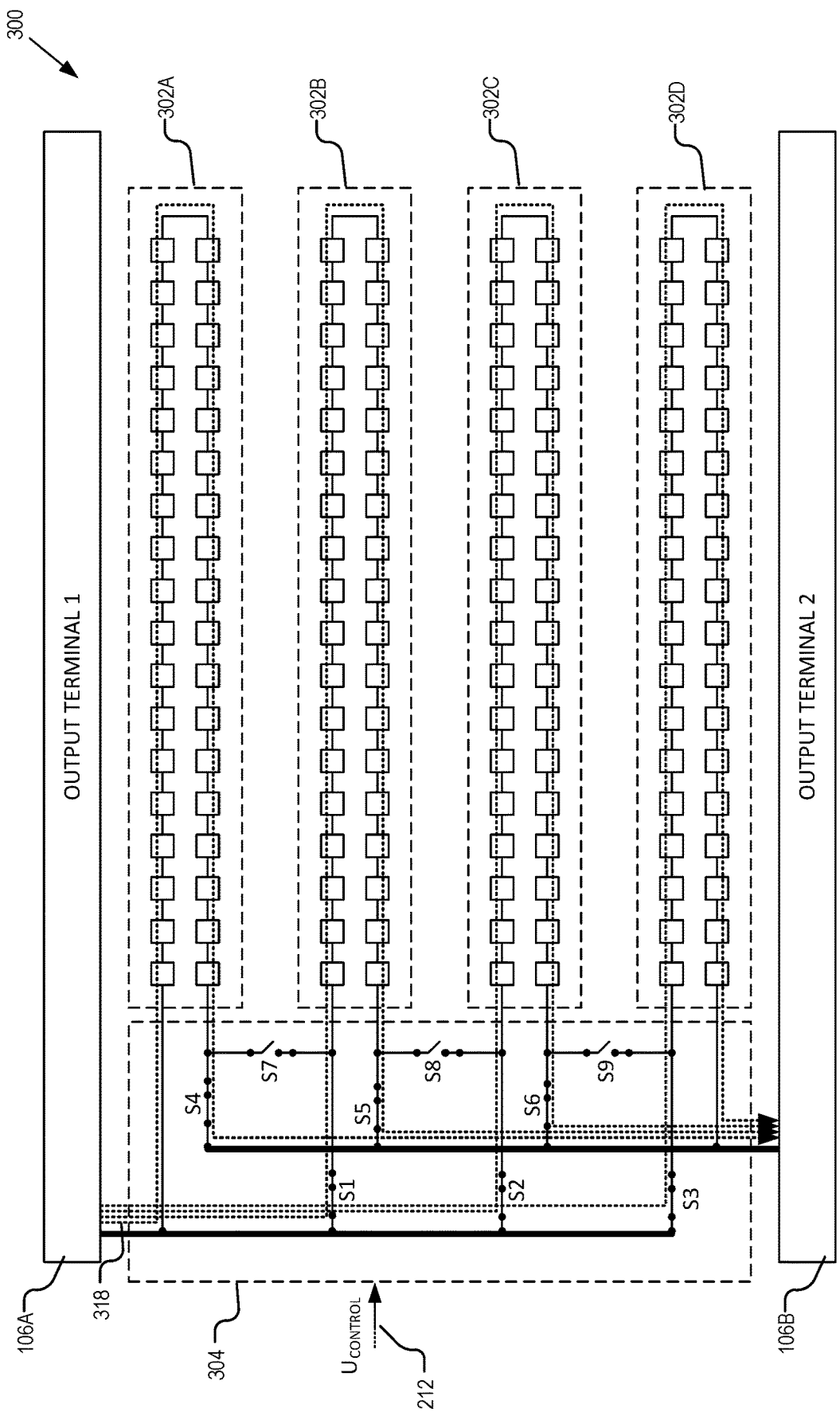

FIGS. 5A and 5B illustrate output stages of output circuit 300 connected in a parallel configuration, in accordance with aspects of the disclosure. For the parallel configuration of FIGS. 5A and 5B, the controller (e.g., controller 208 of FIG. 2) may generate the control signal 212 to enable (i.e., close) switches S1, S2, S3, S4, S5, and S6, and to disable (i.e., open) switches S7, S8, and S9. FIG. 5B illustrates the current paths 318 when the output stages 302A-302D are connected in the parallel configuration. In some embodiments, the power converter generates a minimum output voltage and/or a minimum output impedance when the output stages 302A-302D are connected in the parallel configuration.

The examples provided above illustrate a series configuration (i.e., FIGS. 4A-4B) and a parallel configuration (i.e., FIGS. 5A-5B). However, in some aspects the controller may alternatively, or in addition, may be configured to generate the control signal 212 to reconfigure the connection among the output stages 302A-302D to a series-parallel configuration. In the series-parallel configuration two or more of the output stages 302A-302D may be connected in series, while two or more other output stages or groupings of output stages may be connected in parallel. For example, the switches S1-S9 may be selectively enabled/disabled to connect output stage 302A with output stage 302B in a first series connection and to connect output stage 302C with output stage 302D in a second series connection, where the first series connection is connected in parallel with the second series connection. In this series-parallel example, switches S1, S3, S4, S6, and S8 are disabled (open) and switches S2, S5, S7, and S9 are enabled (closed).

The configuration circuit 304 may be configured to connect the output stages in other series-parallel configurations other than the example described above. For instance, the configuration circuit 304 may be configured to connect output stage 302A in parallel with output stage 302B, to connect output stage 302C in parallel with output stage 302D, and to connect the two parallel groupings in series. In some embodiments, the power converter generates an intermediate output voltage and/or an intermediate output impedance when the output stages 302A-302D are connected in a series-parallel configuration.

In some implementations, one or more of the switches S1-S9 may be manufactured as a top-layer metal segment. When manufactured as a top-layer metal segment, the switch may be initially in a closed/on state. A subsequent manufacturing process may include permanently breaking one or more of the metal segments to change the switch to an open/off state. In some examples, the metal segment may be broken using a laser or a focused ion beam (FIB). This example may allow a designer to determine which switches to engage at the factory allowing multiple different power converter configurations with a single hardware design. In some implementations, the top-layer metal segment may also provide a lower resistance when compared to dynamically reconfigurable switches.

Figure 6A:
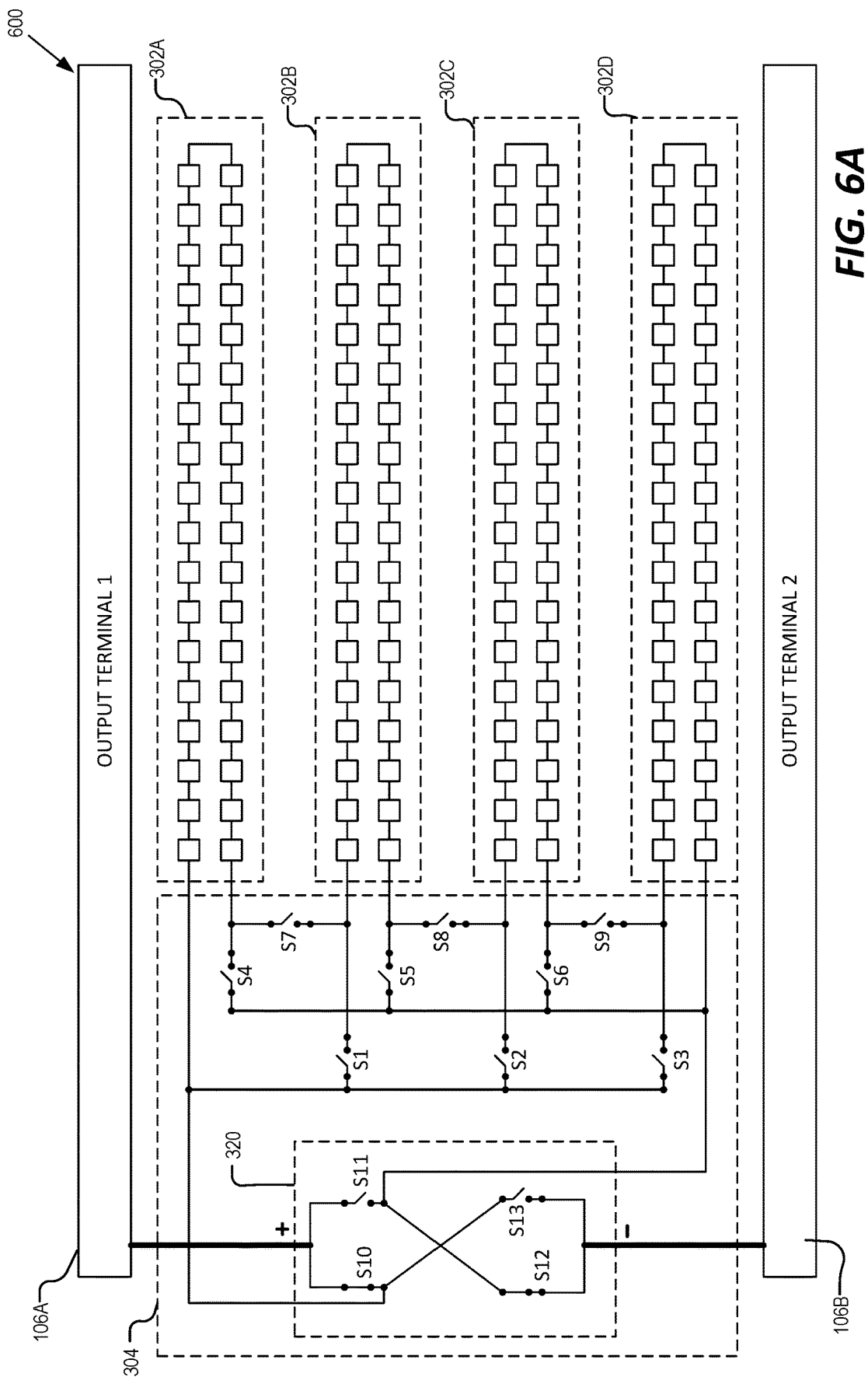

In some systems, it may be advantageous to be able to drive both positive and negative voltages. Accordingly, a configuration circuit may include a polarity configuration circuit, such as polarity configuration circuit 320 of the output circuit 600 of FIGS. 6A and 6B. In some examples, the polarity configuration circuit 320 is configured to selectively switch a polarity between the output terminal 106A and the output terminal 106B. The illustrated example of polarity configuration circuit 320 is shown as including four switches S10, 511, S12, and S13 arranged in an "H-Bridge" configuration. However, polarity configuration circuit 320 may include any number of switches and/or other passive or active electronic components. In some aspects, the state (i.e., open or closed) of switches S10-S13 is controlled via the control signal 212 provided by the controller 208. FIG. 6A illustrates the polarity configuration circuit 320 in a first state, such that the output stages 302A-302D provide a positive output voltage at output terminal 106A. FIG. 6B illustrates the polarity configuration circuit 320 in a second state, such that the output stages 302A-302D provide a negative output voltage at output terminal 106A.

Figure 7:
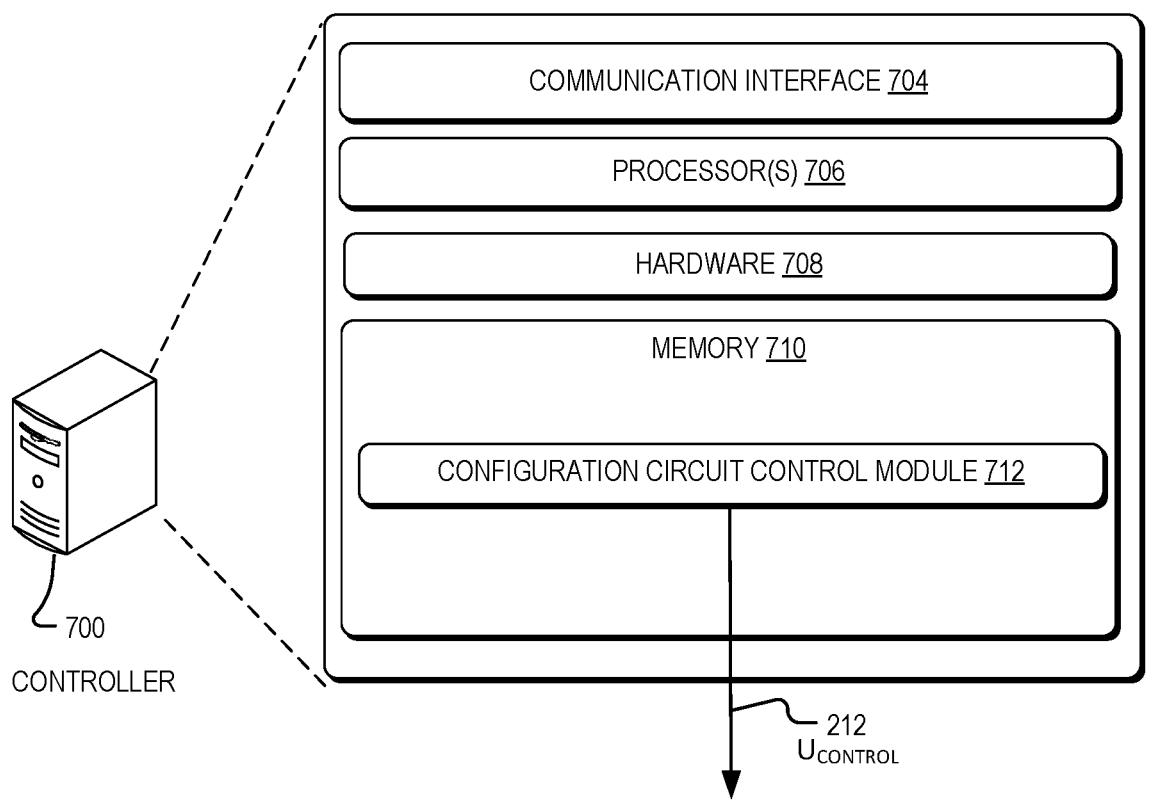
FIG. 7 illustrates an example controller, in accordance with aspects of the disclosure.

FIG. 7 illustrates an example controller 700, in accordance with aspects of the disclosure. The illustrated example of controller 700 is shown as including a communication interface 704, one or more processors 706, hardware 708, and a memory 710.

The communication interface 704 may include wireless and/or wired communication components that enable the controller 700 to transmit data to and receive data from other networked devices. The hardware 708 may include additional hardware interface, data communication, or data storage hardware. For example, the hardware interfaces may include a data output device and one or more data input devices.

The memory 710 may be implemented using computer-readable media, such as computer storage media. In some aspects, computer-readable media may include volatile and/or non-volatile, removable and/or non-removable media implemented in any method or technology for storage of information such as computer-readable instructions, data structures, program modules, or other data. Computer-readable media includes, but is not limited to, RAM, ROM, EEPROM, flash memory or other memory technology, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

The processors 706 and the memory 710 of the controller 700 may implement a configuration circuit control module 712. The configuration circuit control module 712 may include routines, program instructions, objects, and/or data structures that perform particular tasks or implement particular abstract data types. The memory 710 may also include a data store (not shown) that is used by the configuration circuit control module 712.

The configuration circuit control module 712 may be configured to selectively provide the control signal 212 to a configuration circuit (e.g., configuration circuit 304 of FIG. 3) to dynamically reconfigure one or more connections among the output stages 302A-302D. As described above, reconfiguration of the connections among the output stages 302A-302D may be utilized to adjust a combined output voltage, a combined output current, and a combined output impedance of the power converter. In some examples, the configuration circuit control module 712 may set the connection among the output stages to a configuration to allow the power converter to generate a known output (e.g., set to the series configuration to generate a maximum output voltage of 1024V with an output impedance of 8 k Ohms, set to the series-parallel configuration to generate an intermediate output voltage of 512V, etc.).

In some examples, the configuration circuit control module 712 may include non-volatile memory, such as a register, where the state of one or more of the switches (e.g., switches S1-S9) are based on the values stored in the non-volatile memory. In this embodiment, the non-volatile memory may be field-programmable for changing the configurations of the connections among the output stages. This example may enable a single design for a power converter that supports many different applications, as well as the option to reconfigure the power converter after manufacturing.

In yet another example, the configuration circuit control module 712 may be configured to generate the control signal 212 based on feedback. The feedback may be representative of the output current, output voltage, or other data, such as a measured amount of actuation by an electronic actuator being driven by the power converter.

The following example is provided to illustrate a possible implementation for a power converter with a reconfigurable output, according to aspects described herein. First, assume a power converter where the output voltage is desired to have a range of 0V to 1000V. Furthermore, assume the output circuit includes ten output stages, each capable of generating a partial output voltage of 100V. In order to achieve a combined output voltage of 1000V at the output terminals, all ten output stages may be connected in the series configuration (i.e., all ten output stages connected in series). The power converter may then dynamically change its combined output voltage to 500V by reconfiguring the connection among the output stages to a series-parallel configuration with two parallel networks, each with five output stages connected in series. Similarly, the power converter may then adjust the output voltage to 200V with five parallel networks, each with two output stages connected in series. In some examples, connecting output stages in parallel reduces the output impedance is reduced which can either enable a higher peak current output or reduce the internal losses (i.e. power dissipation).

Figure 8:
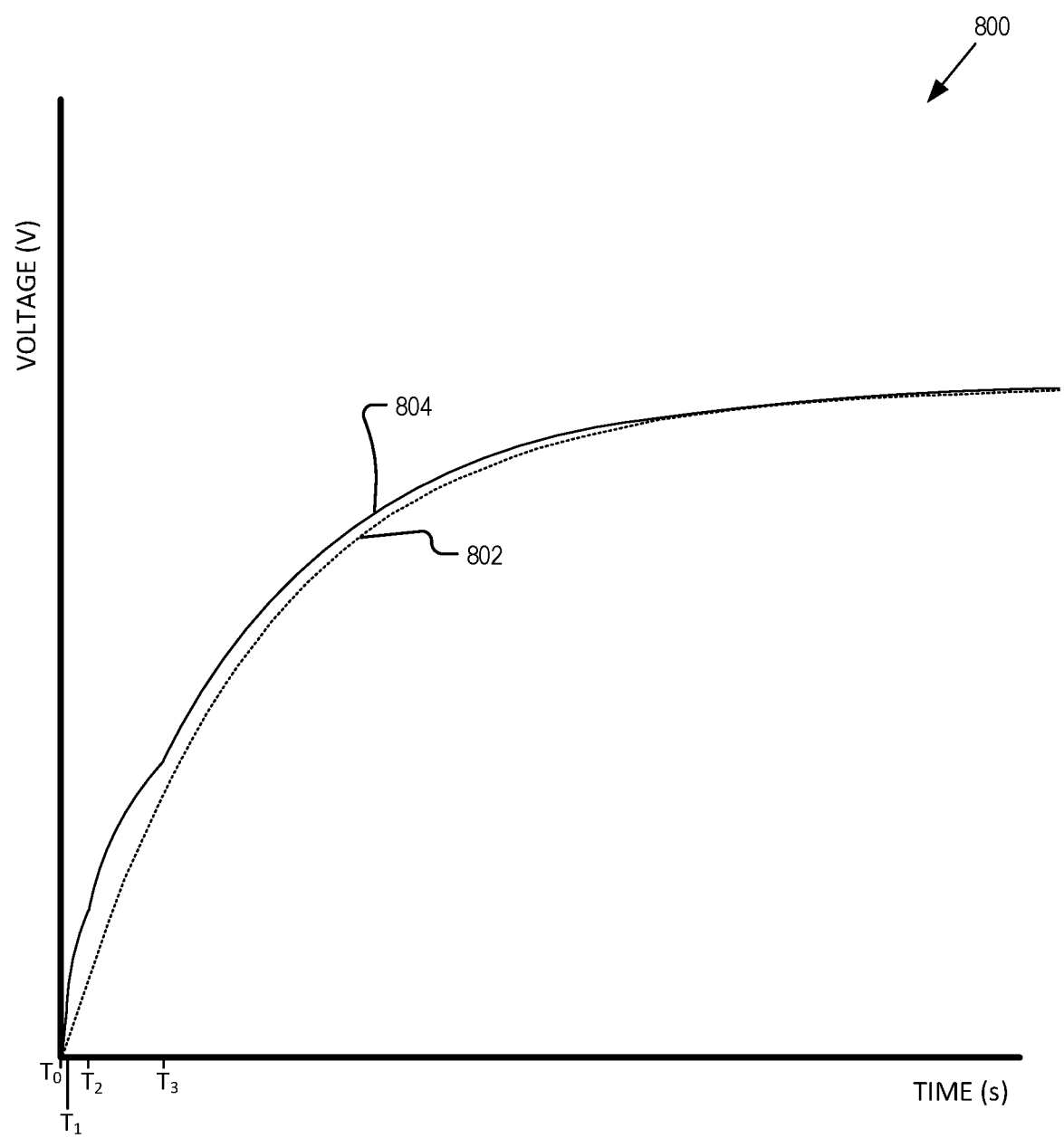
FIG. 8 is a graph illustrating a charging of a load, in accordance with aspects of the disclosure.

In some implementations, the reconfiguration of the connection among the output stages may be performed dynamically while charging a load to reduce the time required to achieve a desired output voltage. As mentioned above, this may be useful when the load is a capacitive or inductive load. For example, if a 1000V combined output voltage is desired at the output terminals and the load is capacitive, the time required to reach the 1000V combined output voltage is based on the output impedance of the power converter and the capacitance of the load. In some aspects, the capacitance of the load and the output impedance of the power converter form a time constant according to:

$$\text{time constant} = R_O * N * C_{load}, \quad \text{EQ (1)}$$

where N is the number of output stages connected in series, $R_O$ is the output impedance of a single output stage, and $C_{load}$ is the capacitance of the load at the output terminals of the power converter. In this example, the time that it takes to achieve a stable combined output voltage of the power converter can be written as a multiple of the time constant shown in EQ(1). However, as mentioned above, this time can be reduced by dynamically reconfiguring the connections among the output stages while charging the load. By way of example, FIG. 8 is a graph 800 illustrating a charging of a load, in accordance with aspects of the disclosure. The curve 802 illustrates the charging of a capacitive load with a constant or fixed output at the power converter. Curve 804 illustrates the charging of the same load, but with reconfigurations made in the output stage connections during charging. For instance, assume the power converter is configured to generate a maximum output voltage of 1024V, the capacitance of the load is 50 uF, the maximum voltage per output stage is 128V, the impedance of each individual output stage is 1 k Ohm, and that the output circuit include eight output stages. Referring to FIG. 8, for the time period T0-T1, the output stages may be connected in the parallel configuration where all eight output stages are connected in parallel such that the power converter generates an output voltage of 128V and the combined output impedance is 1 kOhm/8. For time period T1-T2, the output stages may be connected in a series-parallel configuration with two series networks, each with four output stages in parallel. During this period, the power converter may provide a combined output voltage of 256V, while the combined output impedance is 1 kOhm*2/4. For time period T2-T3, the output stages may be reconfigured into another series-parallel configuration with four series networks, each having two output stages in parallel. In this configuration, the power converter may generate a combined output voltage of 512V with a combined output impedance of 1 kOhm*4/2. Lastly, for time period T3-T4, the output stages may be configured in the series configuration where all eight output stages are connected in series. For this time period, the power converter may provide a combined output voltage of 1024V with a combined output impedance of 8 kOhm. As shown in FIG. 8, the multi-stage charging represented by curve 804 may achieve a final voltage sooner than that of the single-stage charging represented by curve 802.

Figure 9:
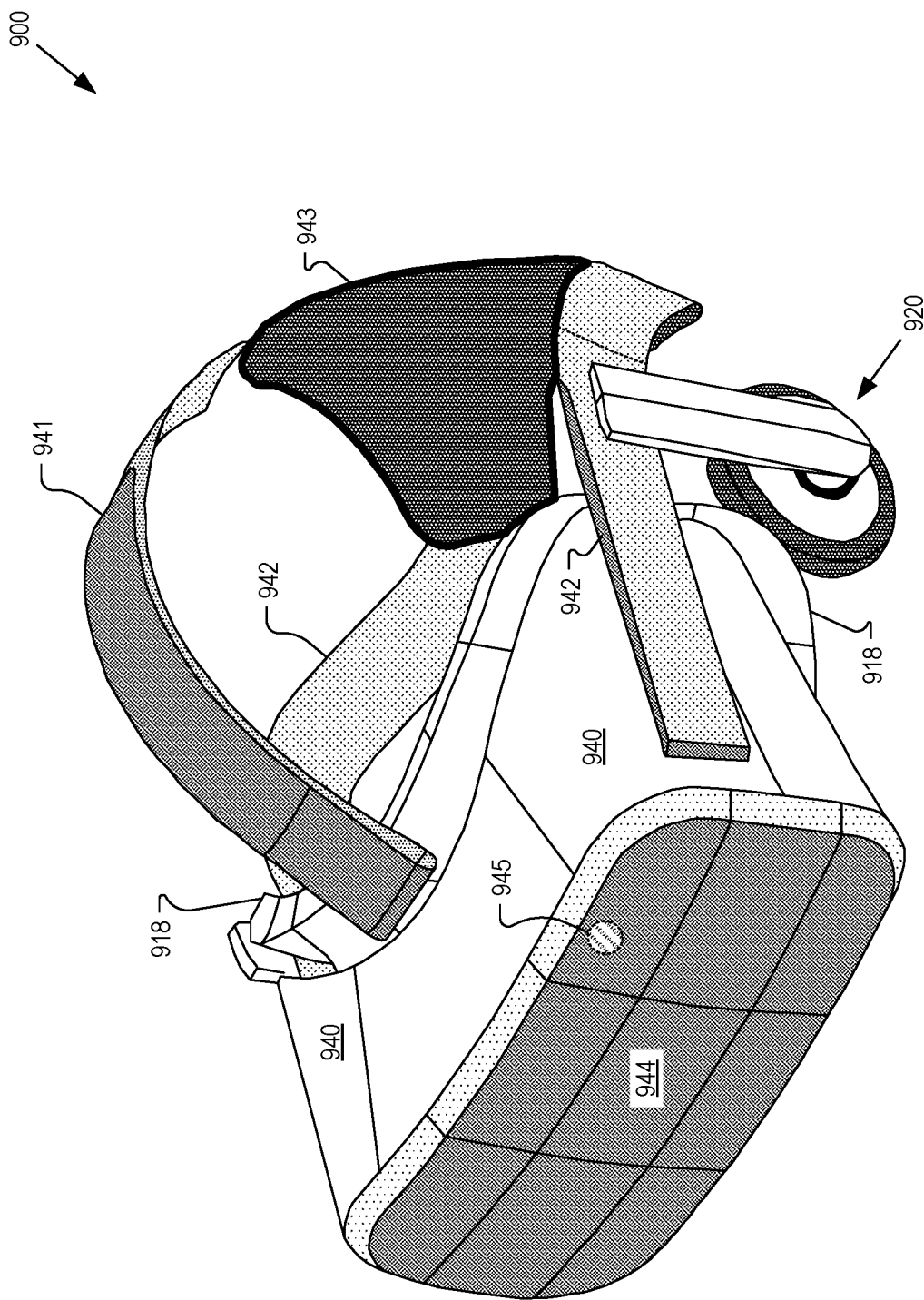
FIG. 9 illustrates an example head-mounted device, in accordance with aspects of the disclosure.

FIG. 9 illustrates an example head-mounted device, in accordance with aspects of the disclosure. In some implementations, aspects of the present disclosure may be utilized in a head mounted device, such as a virtual reality (VR) or in augmented reality (AR) device. In some aspects, a head mounted device may incorporate a haptic feedback device, a deformable lens, or other electronic actuator that may be powered by a power converter, such as power converter 202 of FIG. 2.

By way of example, FIG. 9 illustrates a head-mounted display (HMD) 900, in accordance with aspects of the present disclosure. An HMD, such as HMD 900, is one type of head mounted device, typically worn on the head of a user to provide artificial reality content to a user. Artificial reality is a form of reality that has been adjusted in some manner before presentation to the user, which may include, e.g., virtual reality (VR), augmented reality (AR), mixed reality (MR), hybrid reality, or some combination and/or derivative thereof. The illustrated example of HMD 900 is shown as including a viewing structure 940, a top securing structure 941, a side securing structure 942, a rear securing structure 943, and a front rigid body 944. In some examples, the HMD 900 is configured to be worn on a head of a user of the HMD 900, where the top securing structure 941, side securing structure 942, and/or rear securing structure 943 may include a fabric strap including elastic as well as one or more rigid structures (e.g., plastic) for securing the HMD 900 to the head of the user. HMD 900 may also optionally include one or more earpieces 920 for delivering audio to the ear(s) of the user of the HMD 900.

The illustrated example of HMD 900 also includes an interface membrane 918 for contacting a face of the user of the HMD 900, where the interface membrane 918 functions to block out at least some ambient light from reaching to the eyes of the user of the HMD 900.

Example HMD 900 may also include a chassis for supporting hardware of the viewing structure 940 of HMD 900 (chassis and hardware not explicitly illustrated in FIG. 9). The hardware of viewing structure 940 may include any of processing logic, wired and/or wireless data interface for sending and receiving data, graphic processors, and one or more memories for storing data and computer-executable instructions. In one example, viewing structure 940 may be configured to receive wired power and/or may be configured to be powered by one or more batteries. In addition, viewing structure 840 may be configured to receive wired and/or wireless data including video data.

Viewing structure 940 may include a display system having one or more electronic displays for directing light to the eye(s) of a user of HMD 900. The display system may include one or more of a liquid crystal display (LCD), an organic light emitting diode (OLED) display, a micro-LED display, etc. for emitting light (e.g., content, images, video, etc.) to a user of HMD 900. The viewing structure 940 may also include an optical assembly that is configured to receive the image light from the display system and generate a virtual image (e.g., by collimating the image light) for viewing by an eye of a wearer of the HMD 900.

In some examples, viewing structure includes one or more electronic components. The electronic components may be powered any of the embodiments discussed herein, including power converter 202 of FIG. 2.

Embodiments of the invention may include or be implemented in conjunction with an artificial reality system.

Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A power converter, comprising:
    an input circuit configured to receive an input voltage or current;
    an output circuit that is electrically isolated from the input circuit and is configured to generate a combined output voltage or a combined output current in response to the input circuit, wherein the output circuit includes a plurality of output stages, where each output stage of the plurality of output stages is configured to generate a respective partial output voltage or current, wherein the input circuit is configured to generate light energy in response to the input voltage or current, and wherein at least one output stage of the plurality of output stages includes one or more photosensitive cells configured to generate the respective partial output voltage or current in response to the light energy;
    a first output terminal and a second output terminal, wherein the first output terminal and the second output terminal are to be coupled to provide the combined output voltage or the combined output current to a load; and
    a configuration circuit coupled to the plurality of output stages to dynamically reconfigure a connection among the plurality of output stages.

2. The power converter of claim 1, wherein the configuration circuit comprises a polarity configuration circuit coupled between the first output terminal and the second output terminal, the polarity configuration circuit configured to selectively switch a polarity between the first output terminal and the second output terminal.

3. The power converter of claim 1, wherein the one or more photosensitive cells comprise a photovoltaic cell.

4. The power converter of claim 1, wherein the configuration circuit comprises a first switch, a second switch, and a third switch coupled to a first output stage of the plurality of output stages.

5. The power converter of claim 1 further comprising:
    a controller configured to provide one or more control signals to the configuration circuit to reconfigure the connection among the plurality of output stages.

6. The power converter of claim 1, wherein the load comprises an electronic actuator, a haptic feedback device, or a deformable lens.

7. The power converter of claim 1, wherein the load is a capacitive load.

8. An apparatus, comprising:
    a load; and
    a power converter coupled to provide a combined output voltage or a combined output current to the load, the power converter comprising:
        an input circuit configured to receive an input voltage or current;
        an output circuit that is electrically isolated from the input circuit and is configured to generate the combined output voltage or the combined output current in response to the input circuit, wherein the output circuit includes a plurality of output stages, where each output stage of the plurality of output stages is configured to generate a respective partial output voltage or current;
        a first output terminal; and
        a second output terminal;
    a configuration circuit coupled to the plurality of output stages to dynamically reconfigure a connection among the plurality of output stages, wherein the configuration circuit includes a polarity configuration circuit coupled between the first output terminal and the second output terminal and is configured to selectively switch a polarity between the first output terminal and the second output terminal; and
    a controller configured to provide one or more control signals to the configuration circuit to reconfigure the connection among the plurality of output stages.

9. The apparatus of claim 8, wherein the load is a capacitive load, and wherein the controller is configured to set the configuration circuit to provide a first connection configuration among the plurality of output stages for a first time period of a charging of the capacitive load, and to set the configuration circuit to provide a second connection configuration among the plurality of output stages for a second time period of the charging of the capacitive load.

10. The apparatus of claim 8, wherein the plurality of switches comprises a first switch and a second switch, and wherein the first switch is disposed to selectively connect a first terminal of a first output stage of the plurality of output stages to the first output terminal of the power converter and the second switch is disposed to selectively connect a second terminal of the first output stage to the second output terminal of the power converter.

11. The apparatus of claim 8, wherein the load comprises a deformable lens.

12. The apparatus of claim 8, wherein the load comprises a haptic feedback device.

13. A configuration circuit, comprising:
   a plurality of switches to be coupled to a plurality of output stages of a power converter, wherein the plurality of switches comprises a first switch, a second switch, and a third switch, each to be coupled to a first output stage of the plurality of output stages, wherein the first switch is disposed to selectively connect a first terminal of the first output stage to a first output terminal of the power converter, the second switch is disposed to selectively connect a second terminal of the first output stage to a second output terminal of the power converter, and the third switch is disposed to selectively connect the second terminal of the first output stage to a second output stage of the plurality of output stages; and
   a controller coupled to provide a control signal to the plurality of switches to dynamically reconfigure a connection among the plurality of output stages, wherein the controller is configured to set the configuration circuit to provide a first connection configuration among the plurality of output stages for a first time period of a charging of a capacitive load, and to set the configuration circuit to provide a second connection configuration among the plurality of output stages for a second time period of the charging of the capacitive load.

14. The configuration circuit of claim 13, wherein the controller is configured to: (1) provide a first control signal to the configuration circuit to set the connection among the plurality of output stages to a series configuration, (2) provide a second control signal the configuration circuit to set the connection among the plurality of output stages to a parallel configuration, and (3) provide a third control signal to the configuration circuit to set the connection among the plurality of output stages to a series-parallel configuration.

15. The configuration circuit of claim 13, wherein the capacitive load comprises an electronic actuator, a haptic feedback device, or a deformable lens.

16. The configuration circuit of claim 13, wherein the controller comprises non-volatile memory, and wherein a state of at least one switch of the plurality of switches is based on a value stored in the non-volatile memory.

* * * * *